(12) United States Patent  
Asamura (10) Patent No.: US 8,878,993 B2  
(45) Date of Patent: Nov. 4, 2014

(54) IMAGE DATA PROCESSING APPARATUS (75) Inventor: Yoshinori Asamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1966 days.

(21) Appl. No.: 11/980,476

(22) Filed: Oct. 31, 2007

(65) Prior Publication Data

US 2008/0231749 A1 Sep. 25, 2008

(30) Foreign Application Priority Data

Mar. 19, 2007 (JP) ................................. 2007-070095

(51) Int. Cl.
*H03L 7/00* (2006.01)
*H04N 5/04* (2006.01)
*G09G 5/00* (2006.01)
*H03L 7/07* (2006.01)
*G09G 5/12* (2006.01)

(52) U.S. Cl.
CPC .. *H03L 7/07* (2013.01); *G09G 5/12* (2013.01); *G09G 5/008* (2013.01)
USPC .......................................... 348/537; 348/500

(58) Field of Classification Search
CPC ................................. H04N 5/126; H04N 5/04
USPC ................................... 348/500, 501, 522, 537
See application file for complete search history.

(56) References Cited

U.S. PATENT DOCUMENTS

| 5,914,728 | A | * | 6/1999 | Yamagishi et al. | 345/565 |
| 6,476,684 | B2 | * | 11/2002 | Park | 332/127 |
| 6,763,080 | B1 | | 7/2004 | Higashino | |
| 2002/0044025 | A1 | * | 4/2002 | Park | 332/123 |

FOREIGN PATENT DOCUMENTS

| JP | 5-159043 A | 6/1993 |
| JP | 2000-322150 A | 11/2000 |
| JP | 2005-091509 A | 4/2005 |
| JP | 2006-259764 A | 9/2006 |

* cited by examiner

*Primary Examiner* — Nasser Goodarzi
*Assistant Examiner* — Michael Hong
(74) *Attorney, Agent, or Firm* — Birch, Stewart, Kolasch & Birch, LLP (57) ABSTRACT

An image data processing apparatus of the present invention includes: a base clock output circuit for outputting a base clock; a plurality of image processors; and a plurality of external PLL circuits provided for each one of the plurality of image processors. The plurality of external PLL circuits each synchronize an output clock given from a corresponding one of the plurality of image processors with the base clock.

2 Claims, 7 Drawing Sheets

IMAGE DATA PROCESSING APPARATUS

BACKGROUND OF THE INVENTION

1. Field of the Invention

The present invention relates to an image data processing apparatus for performing image processing upon image data given from a plurality of image formation devices.

2. Description of the Background Art

As disclosed in Japanese Patent Application Laid-Open No. 2005-91509, in a conventionally used image data processing apparatus, image data given from a plurality of image formation devices are taken into corresponding frame memories. The image data taken into the corresponding frame memories are subjected to image processing to thereby form image data capable of being presented at one time on one screen of an image display.

In a plurality of image processors responsible for image processing upon image data, output clocks are generated by respective internal PLL circuits provided inside the image processors. The image processors perform image processing on the basis of these output clocks. Thus synchronization cannot be maintained among output clocks given from respective image processors, failing to properly presenting an image on the image display.

SUMMARY OF THE INVENTION

It is an object of the present invention to maintain synchronization among output clocks given from image processors each time one output clock is provided to thereby properly present an image on an image display.

An image data processing apparatus of the present invention includes: a base clock output circuit for outputting a base clock; a plurality of image processors; and a plurality of synchronization parts provided for each one of the plurality of image processors. The plurality of synchronization parts each synchronize an output clock given from a corresponding one of the plurality of image processors with the base clock.

Thus, synchronization among output clocks given from the plurality of image processors can be maintained each time one output clock is provided to thereby properly present an image on an image display.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
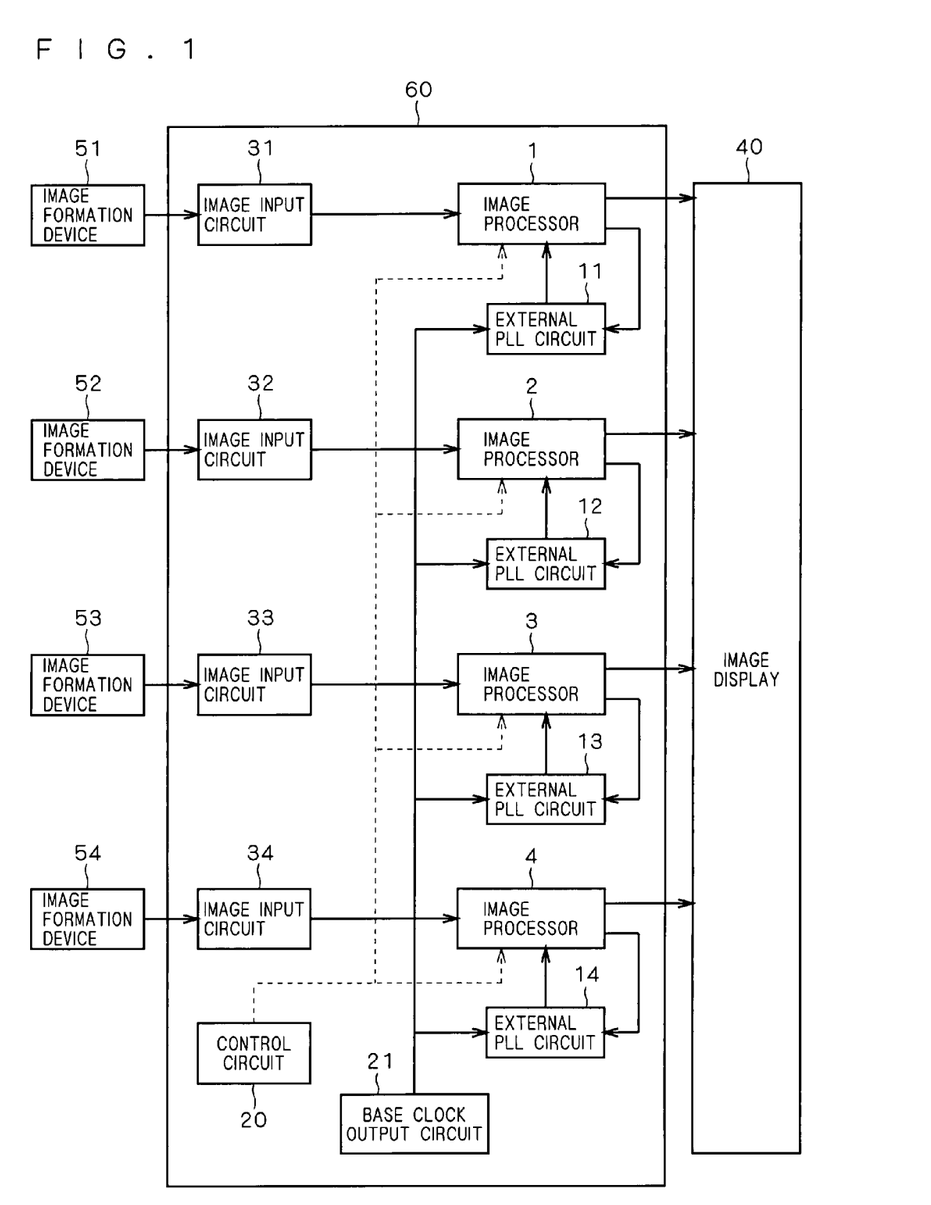
FIG. 1 is a block diagram of an image data processing apparatus according to a first preferred embodiment of the present invention.

FIG. 1 is a block diagram showing the structure of an image data processing apparatus 60 according to a first preferred embodiment of the present invention. With reference to FIG. 1, the image data processing apparatus 60 of the first preferred embodiment includes image processors 1 to 4, external PLL circuits 11 to 14, a control circuit 20, a base clock output circuit 21, and image input circuits 31 to 34.

Figure 2:
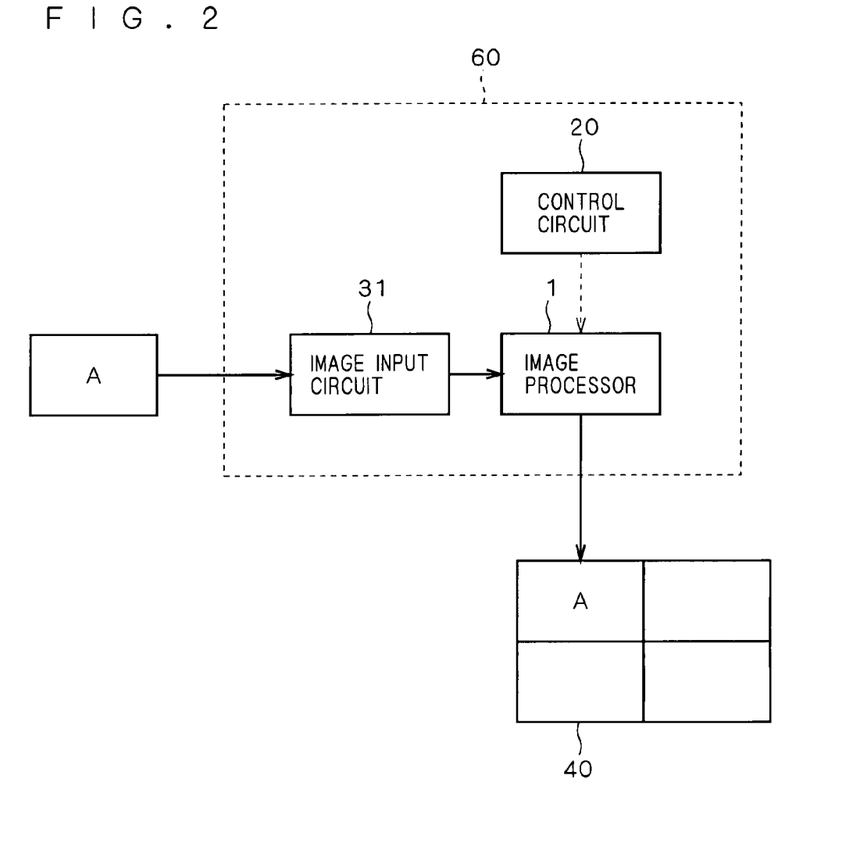
FIG. 2 shows the operation of the image data processing apparatus according to the first preferred embodiment.

An exemplary operation of the image data processing apparatus 60 will be discussed with reference to FIG. 2 showing extracted part of FIG. 1. As shown in FIG. 2, image data such as a character "A" is sent from an image formation device 51 to the image data processing apparatus 60. This image data is received by the image input circuit 31 arranged in the image data processing apparatus 60. In the image data processing apparatus 60, this image data is then subjected to image processing at the image processor 1 under control of the control circuit 20 to thereby generate image data capable of being presented on part of an image display 40.

Then based on the image data generated by the image data processing apparatus 60, an image is presented on the image display 40. Here, by way of example, the image display 40 is divided into four display areas, and an image of the data given from the image processor 1 is presented on the upper left display area.

In the image data processing apparatus 60, image data sent from image formation devices 52 to 54 are also subjected to image processing at the image processors 2 to 4 respectively to thereby generate image data capable of being presented on the other display areas of the image display 40. That is, the image data processing apparatus 60 performs image processing upon image data sent from the image formation devices 51 to 54 respectively to thereby generate image data capable of being presented at one time on one screen of the image display 40.

Next, the structure of the image data processing apparatus 60 of the first preferred embodiment is discussed. The base clock output circuit 21 shown in FIG. 1 provides a base clock to each of the external PLL circuits 11 to 14.

The image input circuits 31 to 34 receive image data respectively given from the image formation devices 51 to 54. The image input circuits 31 to 34 are AD conversion circuits or digital interface circuits, for example, and provide digitized image data to the image processors 1 to 4, respectively.

Figure 3:
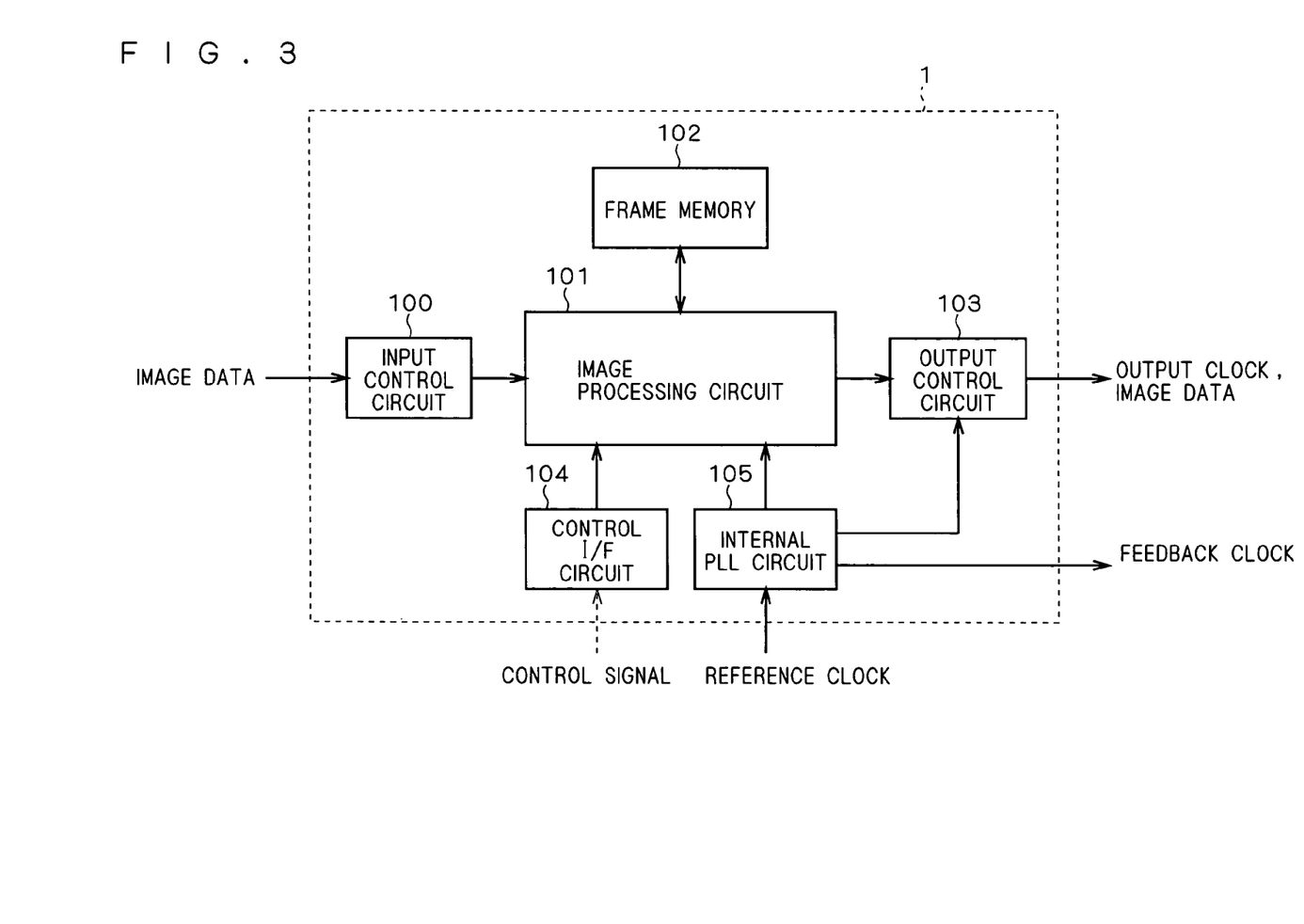
FIGS. 3 and 4 are block diagrams of the image data processing apparatus according to the first preferred embodiment.

FIG. 3 is a block diagram showing the structure of the image processor 1 as a representative of the image processors 1 to 4. The image processor 1 includes an input control circuit 100, an image processing circuit 101, a frame memory 102, an output control circuit 103, a control interface circuit (hereinafter referred to as a control I/F circuit) 104, and an internal PLL circuit 105. While the structure of the image processor 1 is discussed in the following, the other image processors 2 to 4 have the same structure as that of the image processor 1.

The input control circuit 100 receives image data given from the image input circuit 31. The input control circuit 100 clips an effective area from the received image data, and sends the clipped area to the image processing circuit 101.

The image processing circuit 101 is controlled by a control signal that is given through the control I/F circuit 104 from the control circuit 20 provided outside the image processor 1. Using the frame memory 102, the image processing circuit 101 performs image processing such as resolution conversion, scaling transformation and frame rate conversion upon the image data given from the input control circuit 100.

The internal PLL circuit 105 receives a reference clock given from the external PLL circuit 11 discussed later. Based on the received reference clock, the internal PLL circuit 105 generates an output clock and a feedback clock. Then the internal PLL circuit 105 sends the output clock to the image processing circuit 101 and the output control circuit 103, and sends the feedback clock to the external PLL circuit 105.

Figure 4:
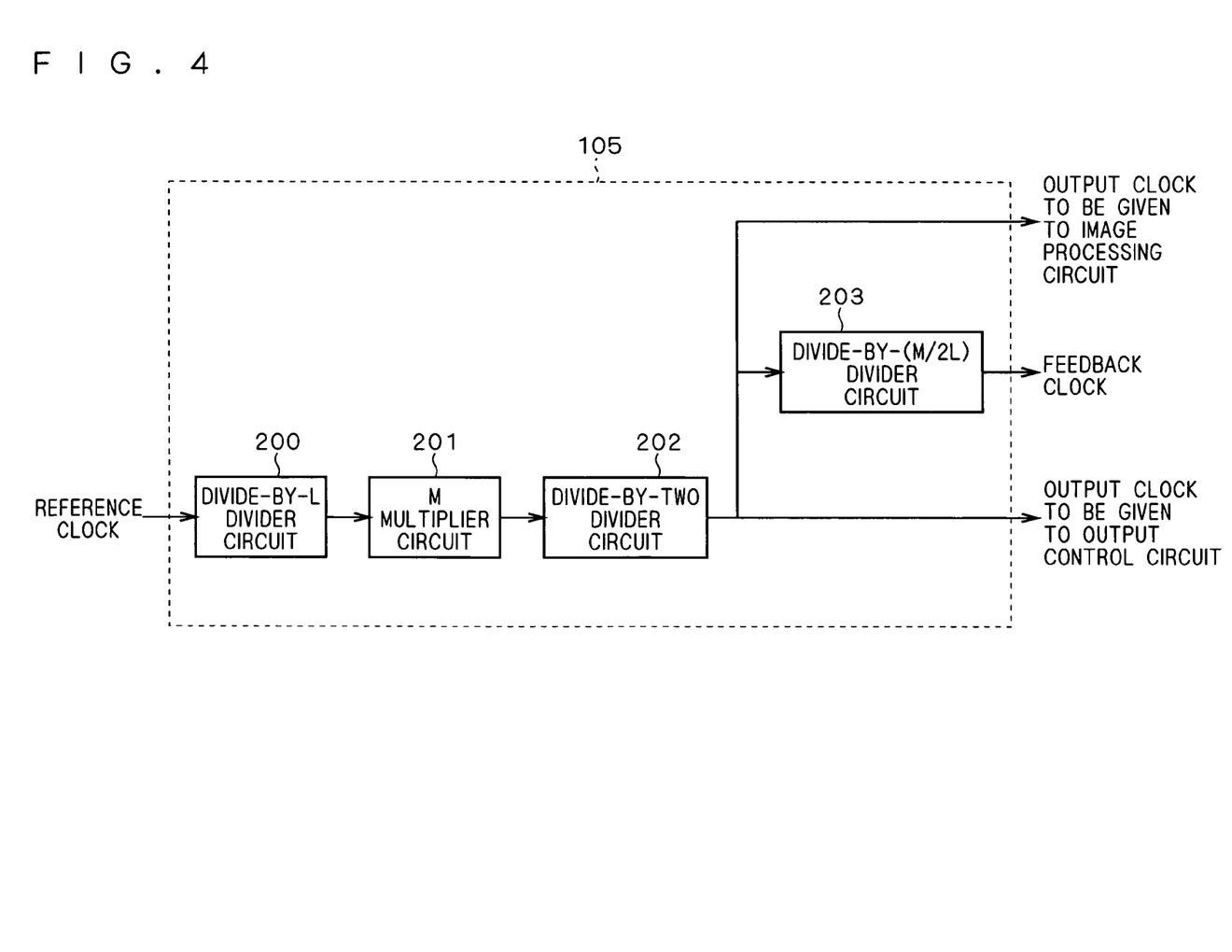

FIG. 4 is a block diagram showing a structure responsible for clock frequency conversion that is extracted from the internal PLL circuit 105. As shown in FIG. 4, the internal PLL circuit 105 includes a divide-by-L divider circuit 200, an M multiplier circuit 201, a divide-by-two divider circuit 202, and a divide-by-(M/2L) divider circuit 203.

The divide-by-L divider circuit 200 divides the frequency of the reference clock given from the external PLL circuit 11 by a factor of L. The M multiplier circuit 201 multiplies the frequency of the clock divided by the divide-by-L divider circuit 200 by a factor of M. The divide-by-two divider circuit 202 divides the frequency of the clock multiplied by the M multiplier circuit 201 by a factor of 2, and sends the converted clock as an output clock to the image processing circuit 101 and the output control circuit 103.

The divide-by-(M/2L) divider circuit 203 divides the frequency of the clock divided by the divide-by-two divider circuit 202 by a factor of M/2L, and sends the converted clock as the feedback clock to the external PLL circuit 11. The factor M/L is an even number of 2 or higher, and the factor M/2L is an integer.

The operation of the internal PLL circuit 105 will be discussed when M/L=4 (M=16 and L=4), for example. Using the divide-by-L divider circuit 200, the M multiplier circuit 201 and the divide-by-two divider circuit 202, the internal PLL circuit 105 sends the output clock to the image processing circuit 101 and the output control circuit 103 that is twice the frequency of the reference clock ($=\frac{1}{4} \times 16 \times \frac{1}{2}$).

Using the internal PLL circuit 105, the image processor 1 converts the reference clock given from the external PLL circuit 11 to the output clock with a frequency that is n times (where n=M/2L and n is an integer) the frequency of the reference clock. The reference clock has a frequency which is the same as that of the base clock given from the base clock circuit 21 shown in FIG. 1. Then in the image processor 1, the output clock oscillates at a frequency that is n times the frequency of the base clock. As discussed above, the index n is 2 when M is 16 and L is 4.

Assuming that the format of an input signal given to the four display areas shown in FIG. 2 is such that an effective image area has 1920 pixels×1080 lines, a dot clock of an image is 145 MHz, a horizontal frequency is 65 KHz and a vertical frequency is 60 Hz, the image processor 1 is required to generate the output clock with a frequency of 145 MHz.

In this case, assuming that the reference clock has a frequency of 72.5 MHz, the image processor 1 is capable of generating, using the internal PLL circuit 105, the output clock with a frequency of 145 MHz that is twice the frequency of the reference clock.

The image processing circuit 101 shown in FIG. 3 performs image processing upon image data in synchronization with an output clock that is caused to oscillate by the internal PLL circuit 105. Thereafter the image processing circuit 101 sends the processed image data to the output control circuit 103. The output control circuit 103 sends the output clock and the image data given from the image processing circuit 101 to the image display 40 at a predetermined time.

Using the divide-by-L divider circuit 200, the M multiplier circuit 201, the divide-by-two divider circuit 202 and the divide-by-(M/2L) divider circuit 203, the internal PLL circuit 105 also sends the feedback clock to the external PLL circuit 11 that is the same in frequency as the reference clock ($=1/L \times M \times \frac{1}{2} \times (2L/M)$).

In the example discussed above where the reference clock has a frequency of 72.5 MHz, the image processor 1 generates, using the internal PLL circuit 105, the feedback clock with a frequency of 72.5 MHz that is the same as the frequency of the reference clock.

Figure 5:
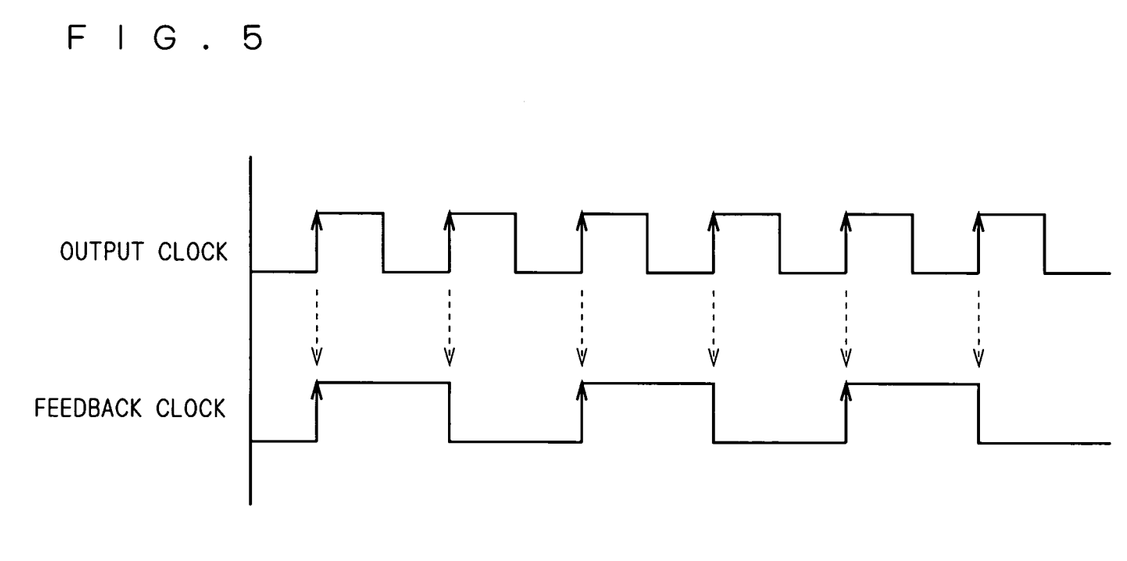
FIG. 5 is a timing diagram showing the operation of the image data processing apparatus according to the first preferred embodiment.

FIG. 5 is a timing diagram for the output clock given from the output control circuit 103 and the feedback clock given from the internal PLL circuit 105. As shown in FIG. 5, the feedback clock has a frequency that is half the frequency of the output clock. The feedback clock rises or falls in synchronization with rising edges of the output clock. That is, the image processors 1 outputs the output clock and the feedback clock while maintaining synchronization therebetween.

As discussed, the image processor 1 shown in FIGS. 1 and 3 performs image processing upon image data given from the image input circuit 31 such as resolution conversion and scaling transformation to generate output image data. Then the image processor 1 sends the image data and the output clock to the image display 40, while sending the feedback clock to the external PLL circuit 11.

The external PLL circuits 11 to 14 shown in FIG. 1 each receive the feedback clock given from a corresponding one of the image processors 1 to 4, and the base clock given from the base clock output circuit 21.

The external PLL circuits 11 to 14 serving as a plurality of synchronization parts are provided for a corresponding one of the image processors 1 to 4. The external PLL circuits 11 to 14 each synchronize the output clock given from the corresponding one of the image processors 1 to 4 with the base clock, which will be discussed next.

In the first preferred embodiment, the external PLL circuits 11 to 14 sends the reference clock to the corresponding one of the image processors 1 to 4. This reference clock is controlled by making comparison in phase between the feedback clock given from the corresponding one of the image processors 1 to 4 and the base clock. Then the external PLL circuits 11 to 14 each synchronize the phase of the feedback clock given from the corresponding one of the image processors 1 to 4 with the phase of the base clock.

As shown in FIG. 5, the image processors 1 to 4 each synchronize the output clock and the feedback clock, and outputs the synchronized clocks. The external PLL circuits 11 to 14 thereby each synchronize the output clock given from the corresponding one of the image processors 1 to 4 with the base clock.

The reference clock is the same in frequency as the base clock. As discussed above, the reference clock and the feedback clock are the same in frequency. This means the base clock, the reference clock and the feedback clock are all in the same frequency.

According to the technique disclosed in the conventional image data processing apparatus, the M multiplier circuit 201 arranged in each internal PLL circuit 105 cannot be controlled from outside even when the image processors 1 to 4 receive reference clocks with the same frequency. Thus M phases of the reference clock are formed in the M multiplier circuit 201, failing to maintain synchronization among the output clocks given from the image processors 1 to 4.

In contrast, according to the above-described image data processing apparatus of the first preferred embodiment, the output clocks given from the image processors 1 to 4 are each synchronized with one base clock. Thus, each time one output clock is provided, synchronization can be maintained among the output clocks given from the image processors 1 to 4 respectively. As a result, an image can be properly presented on the image display 40.

In the first preferred embodiment, the four image processors 1 to 4 are arranged that correspond to the four image formation devices 51 to 54. An arbitrary number of image processors may be provided that correspond to an arbitrary number of image formation devices, in which case the same effect can be produced.

In the foregoing description of the internal PLL circuit 105 arranged in the image processor 1, the factor M/L is set to 4 and the output clock has a frequency that is twice the frequency of the reference clock. The factor M/L may take on alternative values as long as M/L is an even number of 2 or higher.

A circuit designed specifically for clock frequency conversion may be arranged in place of the internal PLL circuit 105 of the image processor 1, in which case the same effect as discussed above can be produced.

Second Preferred Embodiment

In the first preferred embodiment, the external PLL circuits 11 to 14 each make comparison in phase between the base clock given from the base clock output circuit 21 and the feedback clock that is the same in frequency as the base clock. Namely, the operations of the image processors 1 to 4 are based on the presumption that the feedback clocks given from the image processors 1 to 4 are the same in frequency as the base clock.

Even when the feedback clocks given from the image processors 1 to 4 are not the same in frequency as the base clock, a second preferred embodiment of the present invention is intended to maintain synchronization among output clocks given from the image processors 1 to 4 each time one output clock is provided. In the following, elements that correspond to those of the first preferred embodiment will not be discussed again, and will given the same reference numerals.

Figure 6:
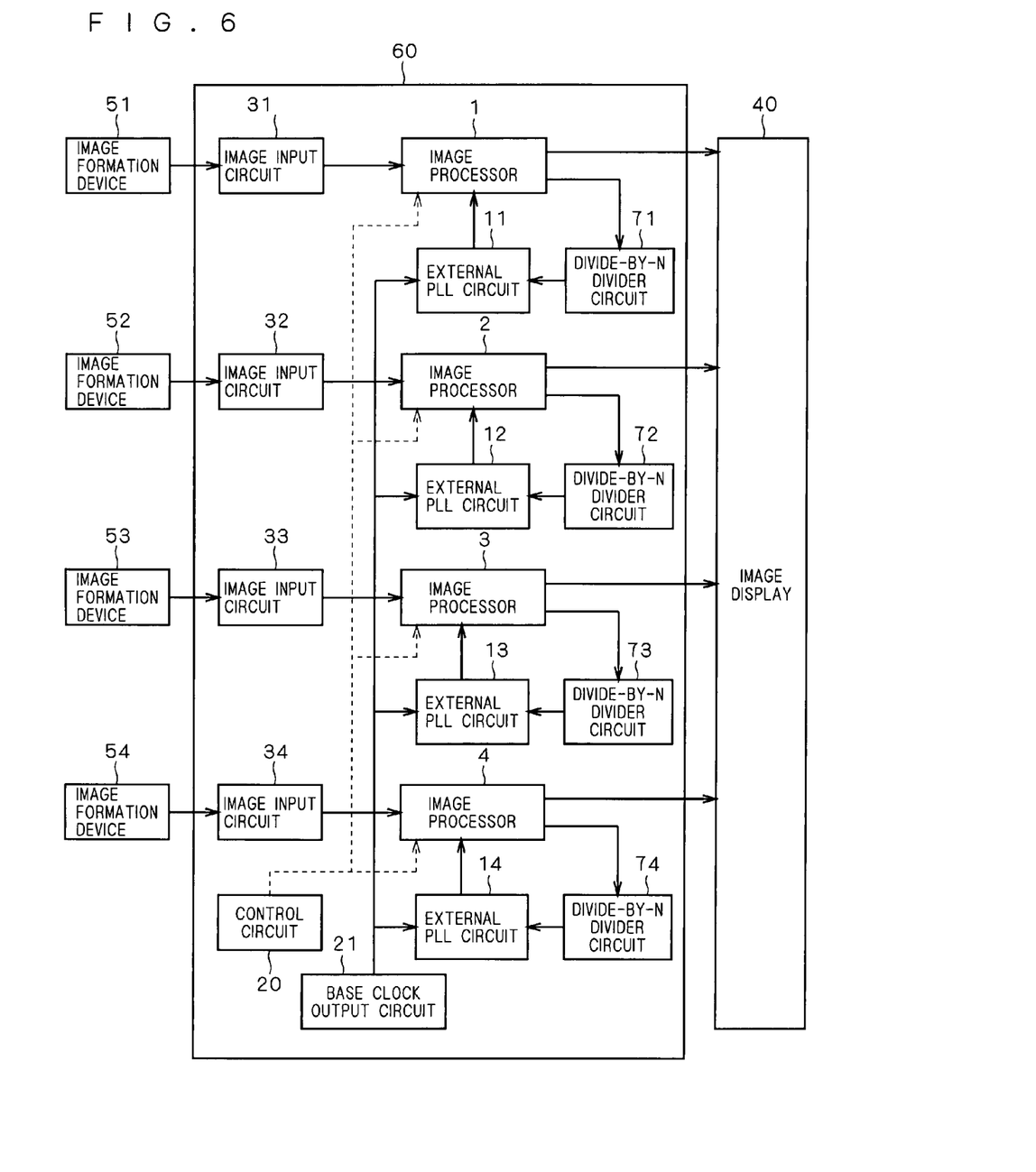
FIGS. 6 and 7 are block diagrams of an image data processing apparatus according to a second preferred embodiment of the present invention.

FIG. 6 is a block diagram showing the structure of an image data processing apparatus 60 according to the second preferred embodiment. As shown in FIG. 6, divide-by-n divider circuits 71 to 74 as a plurality of divider circuits are provided for a corresponding one of the image processors 1 to 4.

Figure 7:
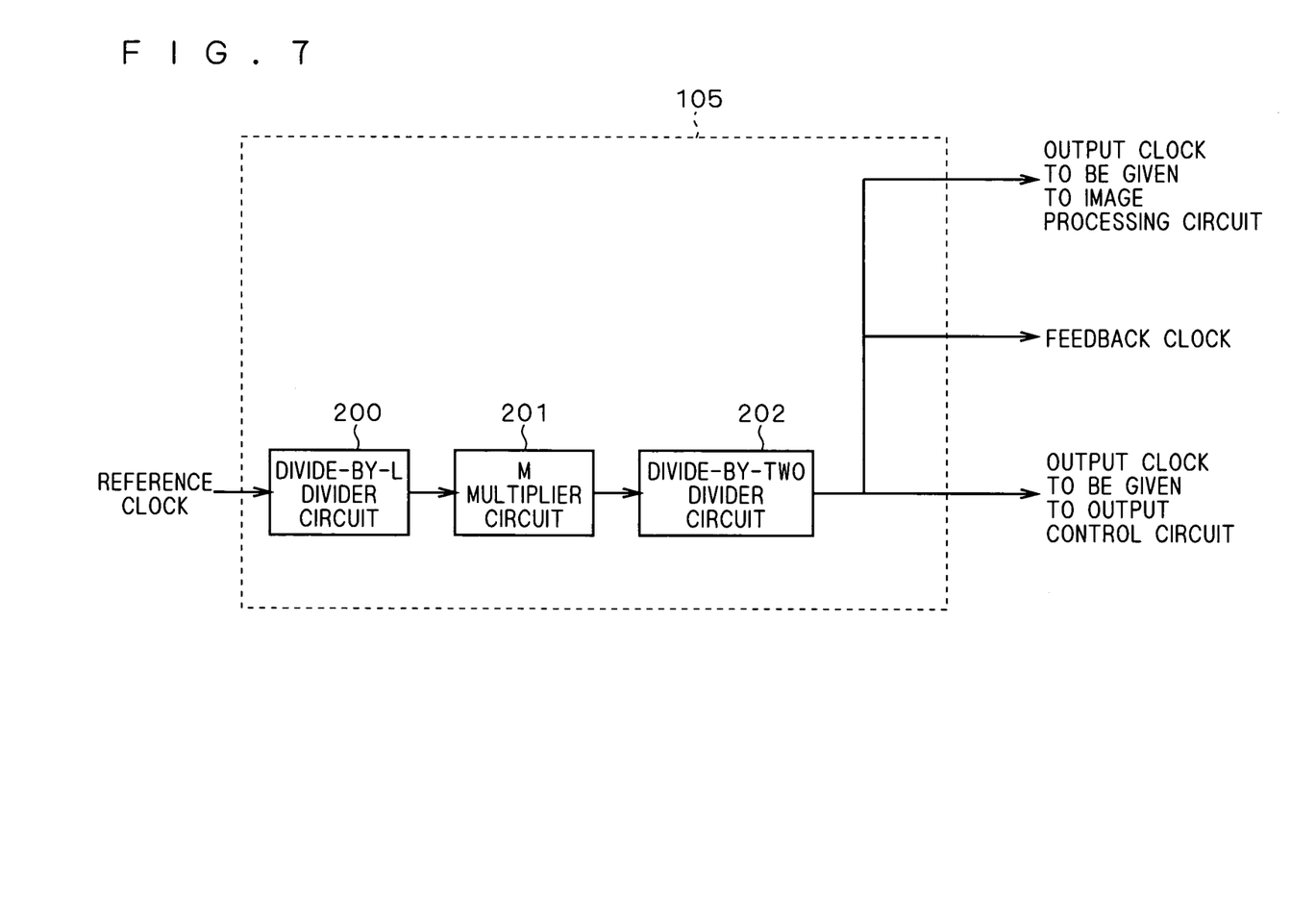

FIG. 7 shows the internal PLL circuit 105 of the image data processing apparatus 60 according to the second preferred embodiment. Like the internal PLL circuit 105 of the first preferred embodiment, the internal PLL circuit 105 of the second preferred embodiment produces and sends the output clock that is caused to oscillate at a frequency that is M/2L times the frequency of the base clock.

Unlike the internal PLL circuit 105 of the first preferred embodiment, the internal PLL circuit 105 of the second preferred embodiment does not include the divide-by-(M/2L) divider circuit 203. Thus even the feedback clock given from the internal PLL circuit 105 of the second preferred embodiment is caused to oscillate at a frequency that is n (=M/2L) times the frequency of the base clock.

The divide-by-n divider circuits 71 to 74 shown in FIG. 6 each divide the output clock given from the corresponding one of the image processors 1 to 4 by a factor of 1/n. In the second preferred embodiment, the output clock corresponds to the feedback clock. The external PLL circuits 11 to 14 as PLL circuits each synchronize the output from the corresponding one of the divide-by-n divider circuits 71 to 74 with the base clock.

In the image data processing apparatus 60 with the above-described structure, the divide-by-n (=M/2L) divider circuits 71 to 74 are provided outside the image processors 1 to 4 in place of the divide-by-(M/2L) divider circuits 203 arranged inside the image processors 1 to 4. Thus, even when the feedback clocks given from the image processors 1 to 4 are not the same in frequency as the base clock, synchronization can be maintained among the output clocks given from the image processors 1 to 4 each time one output clock is provided.

In the second preferred embodiment, the image processors 1 to 4 each produce the output clock and the feedback clock. Alternatively, the image processors 1 to 4 may produce only the output clocks. In this case, each output clock may be distributed to enter the divide-by-n divider circuit.

While the invention has been shown and described in detail, the foregoing description is in all aspects illustrative and not restrictive. It is therefore understood that numerous modifications and variations can be devised without departing from the scope of the invention.

What is claimed is:

1. An image data processing apparatus, comprising:
 a base clock output circuit for outputting a base clock;
 a plurality of image processors each mutually performing the same image processing;
 a plurality of synchronization parts provided for each one of said plurality of image processors, said plurality of synchronization parts each synchronizing an output clock given from a corresponding one of said plurality of image processors with said base clock;
 a plurality of divider circuits provided for each one of said plurality of image processors, said plurality of divider circuits each dividing an output clock given from a corresponding one of said plurality of image processors by a factor of 1/n (where n is an integer), wherein
 said plurality of image processors each cause said output clock to oscillate at a frequency that is n times the frequency of said base clock, and
 said plurality of synchronization parts each include a PLL circuit for synchronizing an output from a corresponding one of said plurality of divider circuits with said base clock.

2. A method of synchronizing a plurality of image processors with a base clock circuit in an image data processing apparatus, each of said plurality of image processors mutually performing the same image processing, the method comprising:
 providing a plurality of synchronization parts such that each image processor is associated with a synchronization part;
 synchronizing, with each synchronization part, an output clock from a corresponding image processor with a base clock from the base clock circuit;
 providing a plurality of divider circuits such that each image processor is associated with a divider circuit;
 dividing, with each divider circuit, an output clock given from a corresponding image processor by a factor of 1/n (where n is an integer) with, wherein
 said plurality of image processors each cause said output clock to oscillate at a frequency that is n times the frequency of said base clock,
 including a PLL circuit in each synchronization part, and synchronizing, with each PLL circuit, an output from a corresponding divider circuit with said base clock.

* * * * *